(12) United States Patent
Ha (10) Patent No.: US 9,589,663 B2
(45) Date of Patent: Mar. 7, 2017

(54) OTP MEMORY CAPABLE OF PERFORMING MULTI-PROGRAMMING AND SEMICONDUCTOR MEMORY DEVICE INCLUDING THE SAME

(71) Applicant: SAMSUNG ELECTRONICS CO., LTD., Suwon-si (KR)

(72) Inventor: Minyeol Ha, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/962,489

(22) Filed: Dec. 8, 2015

(65) Prior Publication Data

US 2016/0172053 A1    Jun. 16, 2016

(30) Foreign Application Priority Data

Dec. 15, 2014    (KR) .................. 10-2014-0180357

(51) Int. Cl.
G11C 17/00 (2006.01)
G11C 17/18 (2006.01)
G11C 17/16 (2006.01)
G11C 29/00 (2006.01)

(52) U.S. Cl.
CPC .............. *G11C 17/18* (2013.01); *G11C 17/16* (2013.01); *G11C 29/785* (2013.01)

(58) Field of Classification Search
CPC .................. G11C 17/16; G11C 17/18
USPC ........................ 365/96, 225.7, 200
See application file for complete search history.

(56) References Cited

U.S. PATENT DOCUMENTS

| 7,180,764 | B2 | 2/2007 | Kim et al. |
| 7,227,802 | B2 | 6/2007 | Jung et al. |
| 8,054,125 | B2 | 11/2011 | Nervegna |
| 8,472,233 | B1 | 6/2013 | Krishnamoorthy et al. |
| 2013/0235644 | A1* | 9/2013 | Chung .................. G11C 17/16 365/103 |
| 2013/0279279 | A1* | 10/2013 | Kim ...................... G11C 17/18 365/194 |

FOREIGN PATENT DOCUMENTS

KR    10-0618865 B1    8/2006

* cited by examiner

*Primary Examiner* — Son Dinh
(74) *Attorney, Agent, or Firm* — Sughrue Mion, PLLC (57) ABSTRACT

A one-time programmable (OTP) memory capable of performing a multi-programming and a semiconductor memory device including the OTP memory are disclosed. The OTP memory includes a plurality of fuse cells in which two or more fuse cells are programmed at a time. In a program mode, in response to determining that a current flowing through each of the fuse cells increases to a predetermined value, the OTP memory blocks the current flowing through each of the fuse cells.

20 Claims, 9 Drawing Sheets

OTP MEMORY CAPABLE OF PERFORMING MULTI-PROGRAMMING AND SEMICONDUCTOR MEMORY DEVICE INCLUDING THE SAME

CROSS-REFERENCE TO RELATED APPLICATION

This application claims priority from Korean Patent Application No. 10-2014-0180357, filed on Dec. 15, 2014 in the Korean Intellectual Property Office, the entire contents of which are incorporated herein by reference in its entirety.

BACKGROUND

Field

Apparatuses and methods consistent with exemplary embodiments relate to a semiconductor memory device, and particularly, to a semiconductor memory device including a one-time programmable (OTP) memory.

Description of Related Art

Semiconductor memory devices may include a one-time programmable (OTP) cell array to store information necessary for operating the semiconductor memory devices. The OTP cell array may include an anti-fuse and an electric fuse. The electric fuse is a device that turns off when a certain condition is satisfied, and the anti-fuse is a device that turns on when a certain condition is satisfied. The anti-fuse or the electric fuse may be used to activate a redundancy array when defective cells are included in a memory cell array.

SUMMARY

Aspects of one or more exemplary embodiments provide a one-time programmable (OTP) memory capable of programming two or more fuse cells at a time.

Aspects of one or more other exemplary embodiments provide a semiconductor memory device including the OTP memory.

The technical objectives of the inventive concept are not limited to the above disclosure; other objectives may become apparent to those of ordinary skill in the art based on the following descriptions.

According to an aspect of an exemplary embodiment, there is provided an OTP memory including: a plurality of fuse cells in which two or more fuse cells are programmed at a time, wherein in a program mode, in response to determining that a current flowing through each of the fuse cells increases to a predetermined value, the OTP memory is configured to block the current flowing through each of the fuse cells.

Each of the fuse cells may include at least one of an anti-fuse cell and an electric fuse cell.

The OTP memory may include a fuse array, a high voltage generator, a program control circuit and a column selecting circuit.

The fuse array includes the plurality of fuse cells connected to word lines, high voltage supplying lines and bit lines. The high voltage generator generates a high voltage and provides the high voltage to the fuse array through the high voltage supplying lines. The program control circuit blocks the current flowing through each of the fuse cells in response to the determining that the current flowing through each of the fuse cells increases to the predetermined value in the program mode. The column selecting circuit is connected between the fuse array and the program control circuit, and selects columns to which fuse cells to be programmed are connected in the program mode.

The OTP memory may further include a sense amplifier configured to sense and amplify information of the fuse cells in a read mode, and output the information.

The sense amplifier comprises a plurality of sense amplifier circuits corresponding to the number of columns of the fuse array.

Each of the fuse cells may include a first N-type metal oxide semiconductor (NMOS) transistor having a gate connected to a high voltage supplying line, and a second NMOS transistor having a gate connected to a word line, a drain connected to a source of the first NMOS transistor, and a source connected to a bit line.

The column selecting circuit may include column selecting transistors configured to electrically connect or disconnect the bit lines and the program control circuit in response to a column selecting signal.

The OTP memory may further include a program inhibit circuit electrically connected to bit lines to which fuse cells are connected, and configured to inhibit programming of unselected fuse cells.

The program inhibit circuit may provide a high voltage to bit lines connected to the fuse cells in response to the determining that the current flowing through each of the fuse cells increases to the predetermined value in the program mode.

The program inhibit circuit may include a P-type metal oxide semiconductor (PMOS) transistor having a source to which a high voltage is applied, a gate to which a control signal is applied, and a drain connected to the bit lines, and he control signal has the same phase as a program enable signal and has a level of a supply voltage if the program enable signal is logic high.

The program control circuit may include a differential amplifier, a current source, a program current detecting circuit and a program down signal generating circuit.

The differential amplifier is connected between the column selecting circuit and a ground voltage, and performs an amplification operation to generate a sensing current in response to a program down signal. The current source provides an operating current to the differential amplifier. The program current detecting circuit generates a program detection voltage based on the sensing current which is proportional to an amount of a current flowing through each of the fuse cells. The program down signal generating circuit generates the program down signal based on the program detection voltage and provides the program down signal to the differential amplifier.

The differential amplifier may include a first NMOS transistor, a second NMOS transistor, a third NMOS transistor and a fourth NMOS transistor.

The first NMOS transistor has a drain connected to the column selecting circuit, a gate to which the program down signal is applied, and a source from which the sensing current is output. The second NMOS transistor has a drain connected to the current source, and a gate to which the program down signal is applied. The third NMOS transistor has a drain connected to the source of the first NMOS transistor, a source connected to the ground voltage, and a gate connected to a source of the second NMOS transistor. The fourth NMOS transistor has a drain and gate commonly connected to the source of the second NMOS transistor, and a source connected to the ground voltage.

The program down signal generating circuit may include an inverter configured to invert a phase of a program enable signal, and a NOR gate configured to perform a NOR operation on an output signal of the inverter and the program detection voltage to generate the program down signal.

The program current detecting circuit may include a PMOS transistor, a first NMOS transistor, a second NMOS transistor, a third NMOS transistor and a latch circuit.

The PMOS transistor has a source connected to a supply voltage, and a gate to which a program enable bar signal, whose phase is opposite from a phase of a program enable signal, is applied. The first NMOS transistor has a drain connected to a drain of the PMOS transistor, and a gate to which the sensing current is applied. The second NMOS transistor has a gate and drain to which the sensing current is applied, and a source connected to the ground voltage. The third NMOS transistor has a gate connected to a source of the first NMOS transistor, and a source connected to the ground voltage. The latch circuit has an input terminal connected to a drain of the third NMOS transistor, and an output terminal from which the program detection voltage is output.

The program current detecting circuit may further include a reset circuit connected between the output terminal of the latch circuit and the ground voltage, and may reset the output terminal of the latch circuit in response to a reset control signal.

The reset circuit may include an NMOS transistor connected between the output terminal of the latch circuit and the ground voltage, and may perform a switch operation in response to the reset control signal.

According to an aspect of another exemplary embodiment, there is provided a semiconductor memory device including: a memory cell array for storing data, and an OTP memory configured to store a fail address corresponding to a defective memory cell of the memory cell array, wherein the OTP memory may include a plurality of fuse cells in which two or more fuse cells are programmed at a time, and block a current flowing through each of the fuse cells in response to determining that the current flowing through each of the fuse cells increases to a predetermined value in a program mode.

The semiconductor memory device may further include an address buffer configured to receive the fail address, a decoder configured to receive a control signal via a control buffer, perform decoding, and generate a mode enable signal, and a controller activated according to the mode enable signal and configured to store the fail address in the OTP memory.

According to an aspect of another exemplary embodiment, there is provided a semiconductor memory system including: a memory controller and a semiconductor memory device including a one-time programmable (OTP) memory, wherein the OTP memory comprises a plurality of fuse cells in which two or more fuse cells are programmed at a time, and is configured to block a current flowing through each of the fuse cells in response to determining that the current flowing through each of the fuse cells increases to a predetermined value in a program mode, and wherein the memory controller is configured to generate an address signal and a command signal and provide the address signal and the command signal to the semiconductor memory device.

The OTP memory may store a fail address corresponding to a defective memory cell of a memory cell array, and the memory controller may select a fuse cell in which the fail address is stored by transmitting data to the fuse cell.

The OTP memory according to exemplary embodiments may include a plurality of fuse cells in which two or more fuse cells are programmed at a time, and, in a program mode, when a current flowing through each of the fuse cells increases to a certain value, the OTP memory blocks the current flowing through each of the fuse cells. Therefore, the OTP memory is able to program two or more fuse cells at a time without increasing a current-supplying capacity of a high voltage generator. Therefore, the OTP memory may have a short program time and a small chip size.

BRIEF DESCRIPTION OF THE DRAWINGS

The foregoing and other features and advantages of the inventive concepts will be apparent from the more particular description of exemplary embodiments, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EXEMPLARY EMBODIMENTS

Exemplary embodiments are described below in sufficient detail to enable those of ordinary skill in the art to embody and practice the present inventive concept. It is important to understand that the present inventive concept may be embodied in many alternate forms and should not be construed as limited to the exemplary embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms "first," "second," "A," "B," etc. may be used herein in reference to elements of exemplary embodiments, such elements should not be construed as limited by these terms. For example, a first element could be termed a second element, and a second element could be termed a first element, without departing from the scope of the present invention. Herein, the term "and/or" includes any and all combinations of one or more referents. Furthermore, expressions such as "at least one of," when preceding a list of elements, modify the entire list of elements and do not modify the individual elements of the list.

Spatially relative terms, such as "beneath," "below," "lower," "above," "upper" and the like, may be used herein for ease of description to describe one element's or feature's relationship to another/other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe exemplary embodiments is not intended to limit the scope of the inventive concept. The articles "a," "an," and "the" are singular in that they have a single referent, however the use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein are to be interpreted as is customary in the art to which exemplary embodiments belong. It will be further understood that terms in common usage should also be interpreted as is customary in the relevant art and not in an idealized or overly formal sense unless expressly so defined herein.

Figure 1:
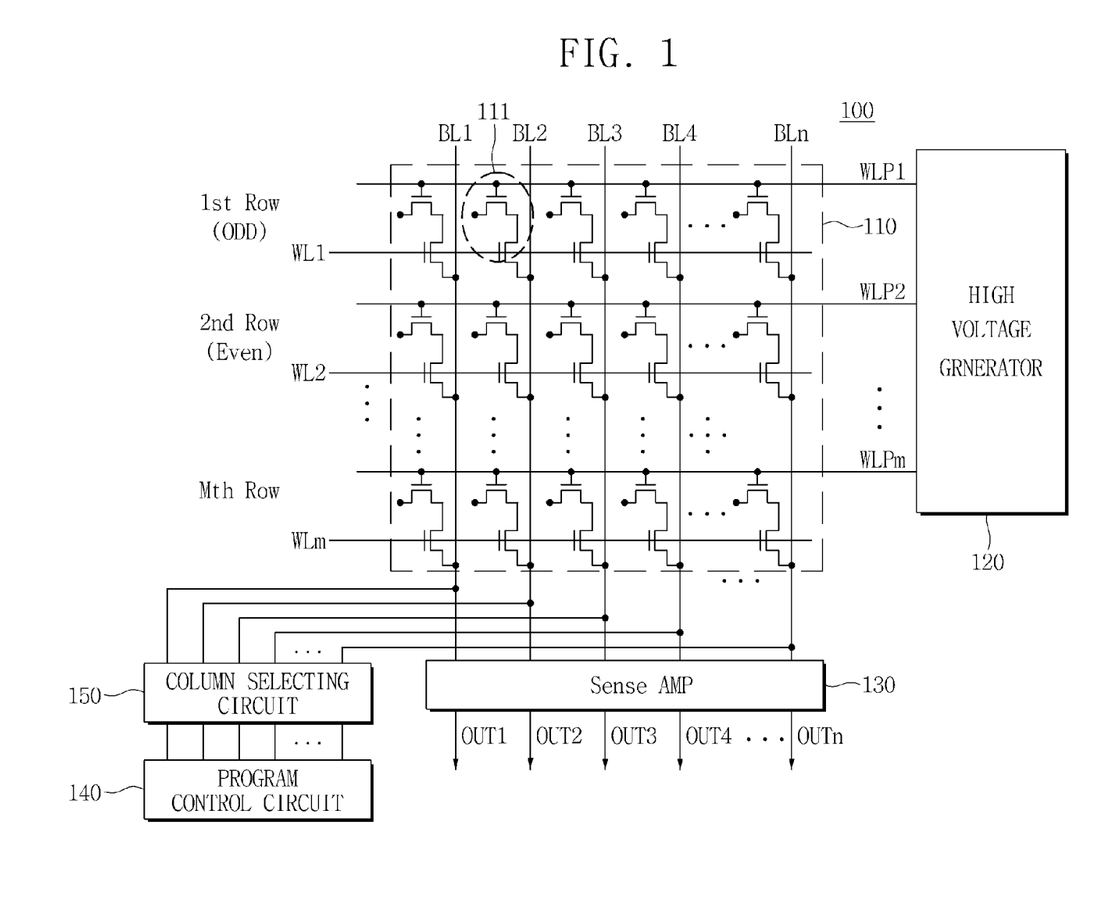
FIG. 1 is a circuit diagram illustrating an OTP memory according to an exemplary embodiment.

FIG. 1 is a circuit diagram illustrating a one-time programmable (OTP) memory 100 according to an exemplary embodiment.

Referring to FIG. 1, the OTP memory 100 may include a fuse array 110, a high voltage generator 120, a program control circuit 140, a column selecting circuit 150 and a sense amplifier circuit 130.

The fuse array 110 includes a plurality of fuse cells 111 connected to word lines WL1 to WLm, high voltage supplying lines WLP1 to WLPm and bit lines BL1 to BLn. The fuse cells 111 may include anti-fuses. The high voltage generator 120 generates a high voltage and provides the high voltage to the fuse array 110 through the high voltage supplying lines WLP1 to WLPm. The program control circuit 140 blocks a current flowing through each of the fuse cells 111 when the current flowing through each of the fuse cells 111 increases to a certain value in the program mode. The column selecting circuit 150 is connected between the fuse array 110 and the program control circuit 140, and selects columns to which cells to be programmed are connected in the program mode. The sense amplifier circuit 130 senses and amplifies information of the fuse cells in a read mode, and outputs the information.

The fuse array 110 includes the plurality of anti-fuses, and the anti-fuses may have a property in which a high resistance state is changed to a low resistance state in response to an electrical signal, for example a high voltage signal.

Though the fuse array 110 including anti-fuses is shown in FIG. 1, the fuse array unit 110 may include electric fuses, the connections of which are controlled according to an electrical signal.

In the following exemplary embodiment, it is assumed that the fuse array 110 is an anti-fuse array including anti-fuses. Also, information stored in the anti-fuses or data read from the anti-fuses will be hereinafter referred to as fuse data.

The fuse array 110 has an array structure in which the anti-fuses 111 are disposed at intersections of a plurality of rows and a plurality of columns. For example, when the fuse array 110 includes m rows and n columns, then the fuse array 110 includes m×n anti-fuses 111. The fuse array 110 includes m word lines WL1 to WLm for accessing the anti-fuses 111 disposed in the m rows, and n bit lines BL1 to BLn disposed to correspond to the n columns to deliver information read from the plurality of anti-fuses 111.

The OTP memory 100 stores a variety of information related to an operation of a semiconductor memory device (200 in FIG. 6) including the fuse array 110. For example, the OTP memory 100 may store a plurality of setting information for setting an operating environment of the semiconductor memory device (200 in FIG. 6). The plurality of setting information are programmed by changing the states of the plurality of anti-fuses 111 by supplying voltage signals WLP1 to WLPm provided from the high voltage generator 120 to the fuse array 110. Information is stored in the plurality of anti-fuses 111 by programming the plurality of anti-fuses 111 to change from the high resistance state to the low resistance state, unlike a general fuse circuit, e.g., a laser fuse circuit or an electric fuse circuit. The plurality of anti-fuses 111 may have a structure in which a dielectric layer is disposed between two conductive layers, i.e., a capacitor structure. The plurality of anti-fuses 111 may be programmed by breaking down the dielectric layer, which is accomplished by applying high voltage between the two conductive layers.

After the fuse array 110 is programmed, a read operation may be performed on the fuse array 110, along with the start of driving a semiconductor memory device. The read operation may be performed on the fuse array 110 simultaneously with the driving of the fuse array 110 or a predetermined set time after the driving of the semiconductor memory device. In the fuse array 110, a word line selection signal is provided via the word lines WL1 to WLm, and information stored in a selected anti-fuse 111 is provided to the sense amplifier 130 via the bit lines BL1 to BLn. According to characteristics of the array structure, the information stored in the fuse array 110 may be randomly accessed by driving the word lines WL1 to WLm and the bit lines BL1 to BLn.

For example, as the word lines WL1 to WLm are sequentially driven, the plurality of anti-fuses 111 are sequentially accessed from a first row to an mth row in the fuse array 110. The information that is sequentially accessed in the plurality of anti-fuses 111 is provided to the sense amplifier 130. The sense amplifier 130 may include one or more sense amplifier circuits. For example, when the fuse array 110 includes n columns, the sense amplifier 130 includes n sense amplifier circuits corresponding to the n columns. The n sense amplifier circuits may be connected to the n bit lines BL1 to BLn, respectively. Two sense amplifier circuits may be disposed to correspond to each of the n bit lines BL1 to BLn. For example, an odd-numbered sense amplifier circuit and an even-numbered sense amplifier circuit are disposed to correspond to a first bit line BL1. The odd-numbered sense amplifier circuit senses/amplifies and outputs information stored in the anti-fuses 111 connected to odd-numbered word lines WL1, WL3, WL5, etc. The even-numbered sense amplifier circuit senses/amplifies and outputs information stored in the anti-fuses 111 connected to even-numbered word lines WL2, WL4, WL6, etc. However, the inventive concept is not limited thereto, and sense amplifier circuits may be disposed in a variety of configurations. For example, only one sense amplifier circuit may be disposed to correspond to one bit line, or three or more sense amplifier circuits may be disposed to correspond to one bit line. Further, a plurality of bit lines may share one sense amplifier circuit.

The sense amplifier 130 senses/amplifies and outputs the information accessed in the fuse array 110. The sensed/amplified information is fuse data OUT1 to OUTn that is actually used to set an operating environment of the semiconductor memory device 200. As described above, in the case in which two sense amplifier circuits are provided to correspond to each bit line, actually, a piece of fuse data, e.g., first fuse data OUT1, may include an odd-numbered piece of fuse data or an even-numbered piece of fuse data.

Figure 2:
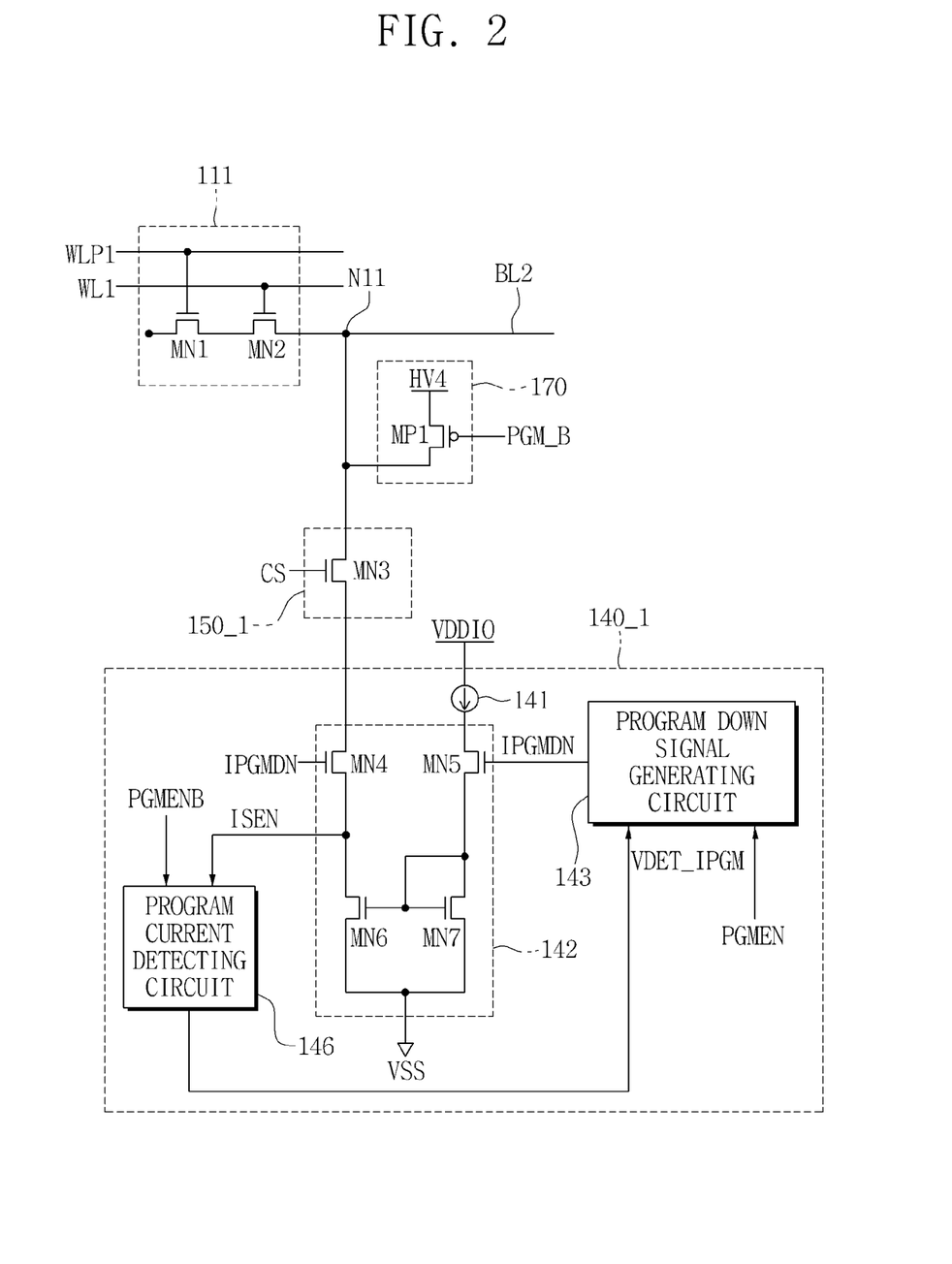
FIG. 2 is a circuit diagram illustrating an operation of the OTP memory shown in FIG. 1 in a program mode.

FIG. 2 is a circuit diagram illustrating an operation of the OTP memory shown in FIG. 1 in a program mode. FIG. 2 shows a circuit connected to one of the anti-fuses 111.

Referring to FIG. 2, the OTP memory may include an anti-fuse 111, a column selecting circuit 150_1, a program control circuit 140_1 and a program inhibit circuit 170.

The anti-fuse 111 may include a first NMOS transistor MN1 having a gate connected to a high voltage supplying line WLP1, and a second NMOS transistor MN2 having a gate connected to a word line WL1, a drain connected to a source of the first NMOS transistor MN1, and a source connected to a first node N11. The first node N11 is connected to a bit line BL2. The column selecting circuit 150_1 may include an NMOS transistor MN3 configured to electrically connect or disconnect the bit line BL2 and the program control circuit 140_1 in response to a column selecting signal CS. The program inhibit circuit 170 is electrically connected to bit lines to which fuse cells are connected, and configured to inhibit programming of unselected fuse cells. The program inhibit circuit 170 may provide a high voltage to the bit line connected to the anti-fuse 111 when a current flowing through each of the anti-fuses 111 increases to a certain value in the program mode. The program inhibit circuit 170 may include a PMOS transistor MP1 which has a source to which a high voltage HV4 is applied, a gate to which a control signal PGM_B is applied, and a drain connected to the bit line BL2. The control signal PGM_B has the same phase as a program enable signal PGMEN, and may have a level of a supply voltage VDD other than a ground voltage VSS when a program enable signal PGMEN is logic high.

The program control circuit 140_1 may include a differential amplifier 142, a current source 141, a program current detecting circuit 146 and a program down signal generating circuit 143.

The differential amplifier 142 is connected between the column selecting circuit 150_1 and the ground voltage VSS, and performs an amplification operation to generate a sensing current ISEN in response to a program down signal IPGMDN. The current source 141 provides an operating current to the differential amplifier 142. The program current detecting circuit 146 generates a program detection voltage VDET_IPGM based on the sensing current ISEN which is proportional to an amount of a current flowing through the anti-fuse 111 and a program enable bar signal PGMENB. The program down signal generating circuit 143 generates the program down signal IPGMDN based on the program detection voltage VDET_IPGM and the program enable signal PGMEN, and provides the program down signal IPGMDN to the differential amplifier 142. The phase of the program enable bar signal PGMENB is opposite from that of the program enable signal PGMEN.

The differential amplifier 142 may include NMOS transistors MN4, MN5, MN6 and MN7. The NMOS transistor MN4 has a drain connected to the column selecting circuit 150_1, a gate to which the program down signal IPGMDN is applied, and a source from which the sensing current ISEN is output. The NMOS transistor MN5 has a drain connected to the current source 141, and a gate to which the program down signal IPGMDN is applied. The NMOS transistor MN6 has a drain connected to the source of the NMOS transistor MN4, a source connected to the ground voltage VSS, and a gate connected to a source of the NMOS transistor MN5. The NMOS transistor MN7 has a drain and gate commonly connected to the source of the NMOS transistor MN5, and a source connected to the ground voltage VSS.

A supply voltage VDDIO may be supplied to the current source 141, and the supply voltage VDDIO may have a higher voltage level than the supply voltage VDD, which is a voltage level of the control signal PGM_B when the control signal PGM_B is logic high.

The OTP memory 100 may block the current flowing through anti-fuses 111 when the current flowing through each of the anti-fuses 111 increases to a certain value in the program mode.

Figure 3:
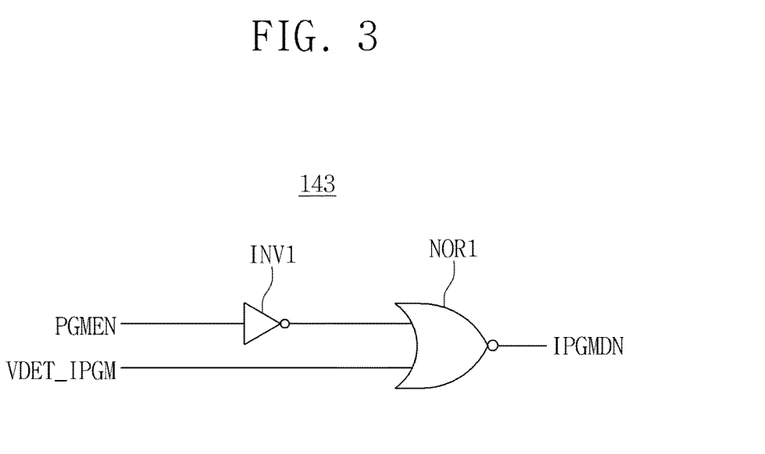
FIG. 3 is a circuit diagram illustrating an exemplary embodiment of a program down signal generating circuit included in the circuit of FIG. 2.

FIG. 3 is a circuit diagram illustrating an exemplary embodiment of a program down signal generating circuit 143 included in the circuit of FIG. 2.

Referring to FIG. 3, the program down signal generating circuit 143 may include an inverter INV1 configured to invert a phase of the program enable signal PGMEN, and a NOR gate NOR1 configured to perform a NOR operation on an output signal of the inverter INV1 and the program detection voltage VDET_IPGM to generate the program down signal IPGMDN.

Figure 4:
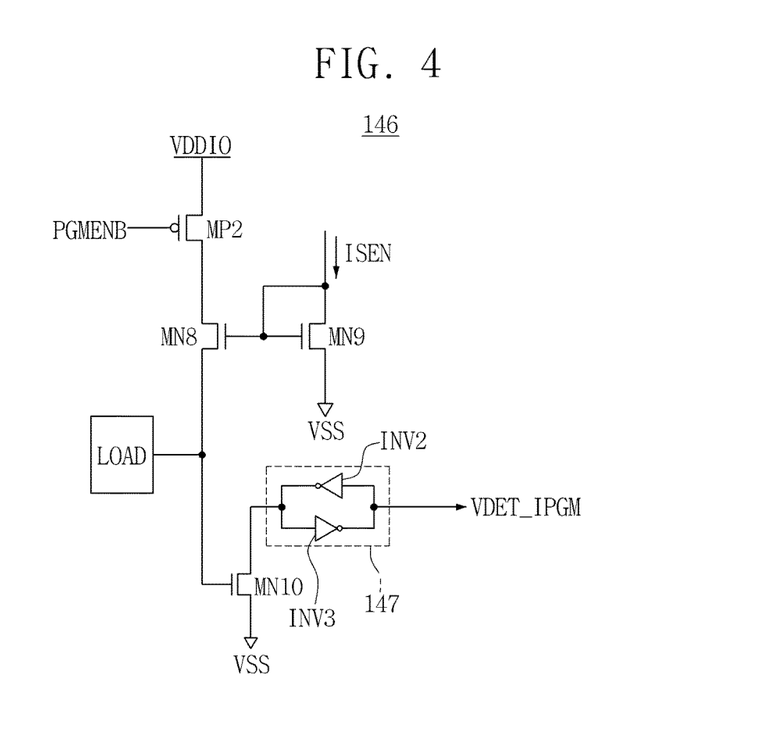
FIG. 4 is a circuit diagram illustrating an exemplary embodiment of a program current detecting circuit included in the circuit of FIG. 2.

FIG. 4 is a circuit diagram illustrating an exemplary embodiment of a program current detecting circuit 146 included in the circuit of FIG. 2.

Referring to FIG. 4, the program current detecting circuit 146 may include a PMOS transistor MP2, NMOS transistors MN8, MN9 and MN10, and a latch circuit 147.

The PMOS transistor MP2 has a source connected to the supply voltage VDDIO, and a gate to which the program enable bar signal PGMENB, whose phase is opposite from that of the program enable signal PGMEN, is applied. The NMOS transistor MN8 has a drain connected to a drain of the PMOS transistor MP2, and a gate to which the sensing current ISEN is applied. The NMOS transistor MN9 has a gate and drain to which the sensing current ISEN is applied, and a source connected to the ground voltage VSS. The NMOS transistor MN10 has a gate connected to a source of the NMOS transistor MN8, and a source connected to the ground voltage VSS. The latch circuit 147 has an input terminal connected to a drain of the NMOS transistor MN10, and an output terminal from which the program detection voltage VDET_IPGM is output. The latch circuit 147 may include inverters INV2 and INV3. A load LOAD may be connected to the source of the NMOS transistor MN8.

When the program enable bar signal PGMENB is logic low and a voltage level of the sensing current ISEN increases to a certain value, MP2 and MN 8 are turned on and the NMOS transistor MN10 is turned on. In this condition, the program detection voltage VDET_IPGM may be logic high. A minimum current may flow through the load LOAD when the NMOS transistor MN10 is turned on.

Figure 5:
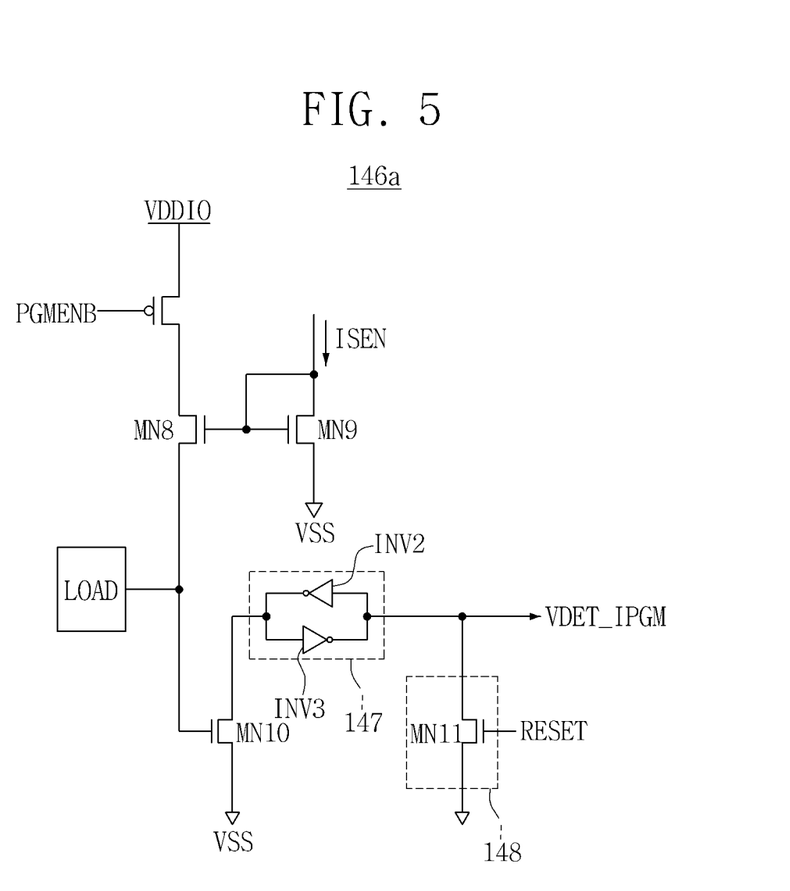
FIG. 5 is a circuit diagram illustrating another exemplary embodiment of a program current detecting circuit included in the circuit of FIG. 2.

FIG. 5 is a circuit diagram illustrating another exemplary embodiment of a program current detecting circuit 146 included in the circuit of FIG. 2.

The program current detecting circuit 146a shown in FIG. 5 may further include a reset circuit 148 which is connected between an output terminal of the latch circuit 147 and the ground voltage VSS, and resets the output terminal of the latch circuit 147 in response to a reset signal RESET, compared with the program current detecting circuit 146 shown in FIG. 4.

Figure 6:
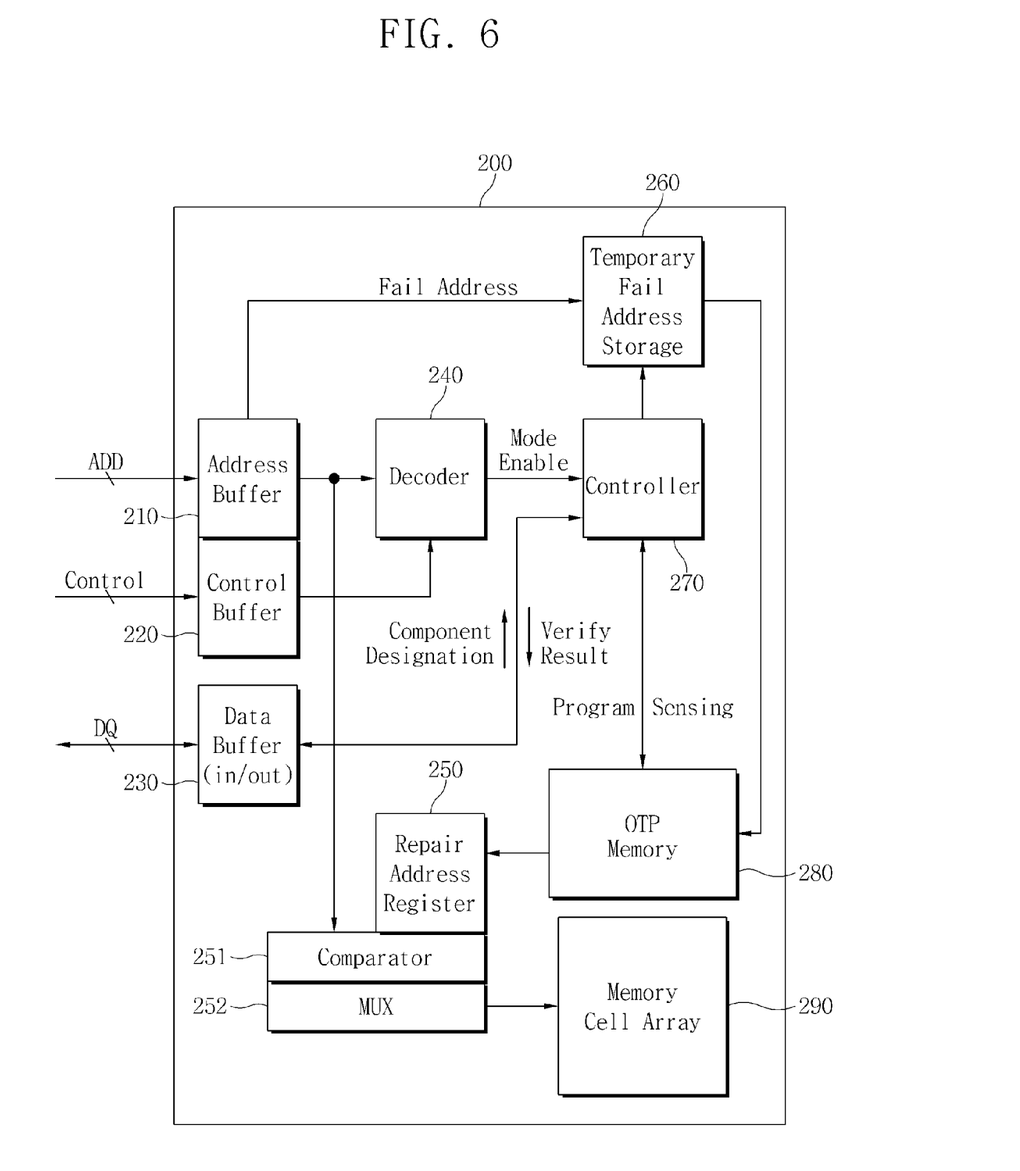
FIG. 6 is a block diagram illustrating an exemplary embodiment of a semiconductor memory device which includes an OTP memory according to exemplary embodiments.

FIG. 6 is a block diagram illustrating an exemplary embodiment of a semiconductor memory device 200 which includes an OTP memory according to exemplary embodiments.

Referring to FIG. 6, the semiconductor memory device 200 includes an address buffer 210, a control buffer 220, a data buffer 230, a decoder 240, a repair address register 250, a comparator 251, a multiplexer (Mux) 252, a temporary fail address storage (TFAS) 260, a controller 270, an OTP memory 280 which is a non-volatile storage device, and a memory cell array 290.

The semiconductor memory device 200 receives a fail address ADD via the address buffer 210 and temporarily stores the fail address ADD in the temporary fail address storage 260. The temporary fail address storage 260 may be embodied, for example, as a register array, a static random access memory (SRAM), or a non-volatile memory (NVM). The decoder 240 receives a control signal via the control buffer 220, performs decoding, and generates a mode enable signal Mode Enable. The control signal may include a read command, a write command, a pre-charge command, a mode register set signal, and the like. The controller 270 is activated according to the mode enable signal Mode Enable, and stores the fail address in the OTP memory 280, which is a NVM storage device. The controller 270 senses the stored fail address to verify whether the fail address is accurately programmed. A result of the programming (verification result) is output via a data output pin. The OTP memory 280 is connected to the repair address register 250 configured to store the fail address. The repair address register 250 is connected to the comparator 251, which is configured to compare the fail address with an external address. The comparator 251 is connected to the multiplexer (Mux) 252, which is configured to select one of the fail address and the external address. Data received via the I/O data buffer 230 may be used as a chip selection signal (component designation) for selecting a chip on a memory module.

The OTP memory 280 of the semiconductor memory device 200 of FIG. 6 may include a plurality of fuse cells in which two or more fuse cells are programmed at a time, and, in a program mode, when a current flowing through each of the fuse cells increases to a certain value, the OTP memory blocks the current flowing through each of the fuse cells. Therefore, the OTP memory 280 is able to program two or more fuse cells at a time without increasing a current-supplying capacity of a high voltage generator. Conventionally, the current-supplying capacity of a high voltage generator, which includes a charge pump, should be increased to perform multi-programming. For increasing the current-supplying capacity of a high voltage generator, a chip size of a semiconductor integrated circuit including an OTP memory may be increased.

Referring to FIGS. 1 to 5, a method of programming an OTP cell array according to an exemplary embodiment may include the following operations.

1) performing programming on fuse cells;
2) detecting a current flowing through each of the fuse cells; and
3) cutting off the current flowing through each of the fuse cells when a current flowing through each of the fuse cells increases to a certain value.

Figure 7:
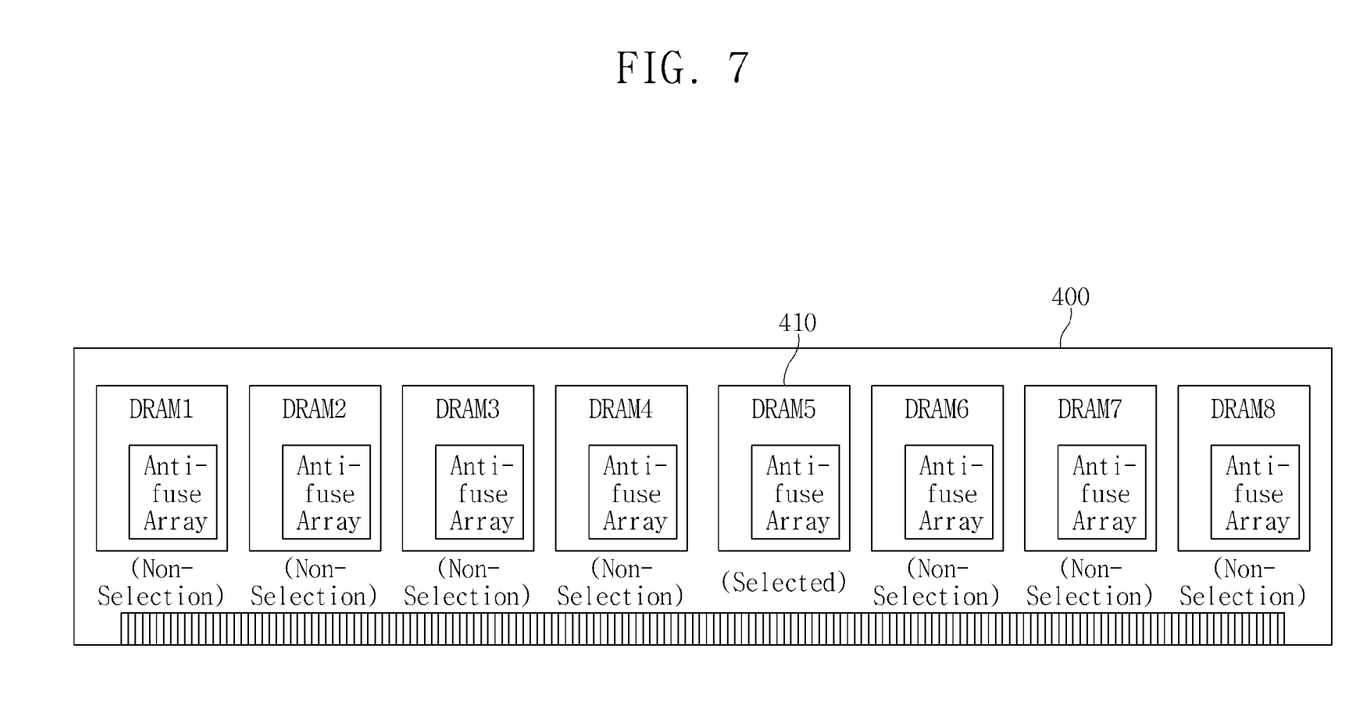
FIG. 7 is a diagram illustrating an exemplary embodiment of a structure of a memory module which includes a semiconductor memory device according to exemplary embodiments.

FIG. 7 is a diagram illustrating an exemplary embodiment of a structure of a memory module 400 which includes a semiconductor memory device according to exemplary embodiments.

Referring to FIG. 7, the module 400 includes one or more memory devices according to exemplary embodiments. For example, the module 400 includes eight dynamic random access memories (DRAMs) 410. Each of the DRAMs 410 includes an anti-fuse array, which is a non-volatile storage device. The anti-fuse array may be an OTP memory included in FIG. 1 or FIG. 6. When a fail address is stored in a DRAM 5, for example, a memory controller may select the DRAM 5 by transmitting data '0' to only the DRAM 5. The anti-fuse array included in each of the DRAMs is used to store a generated fail address in the DRAM. A command and an address are shared by the eight DRAMs.

Figure 8:
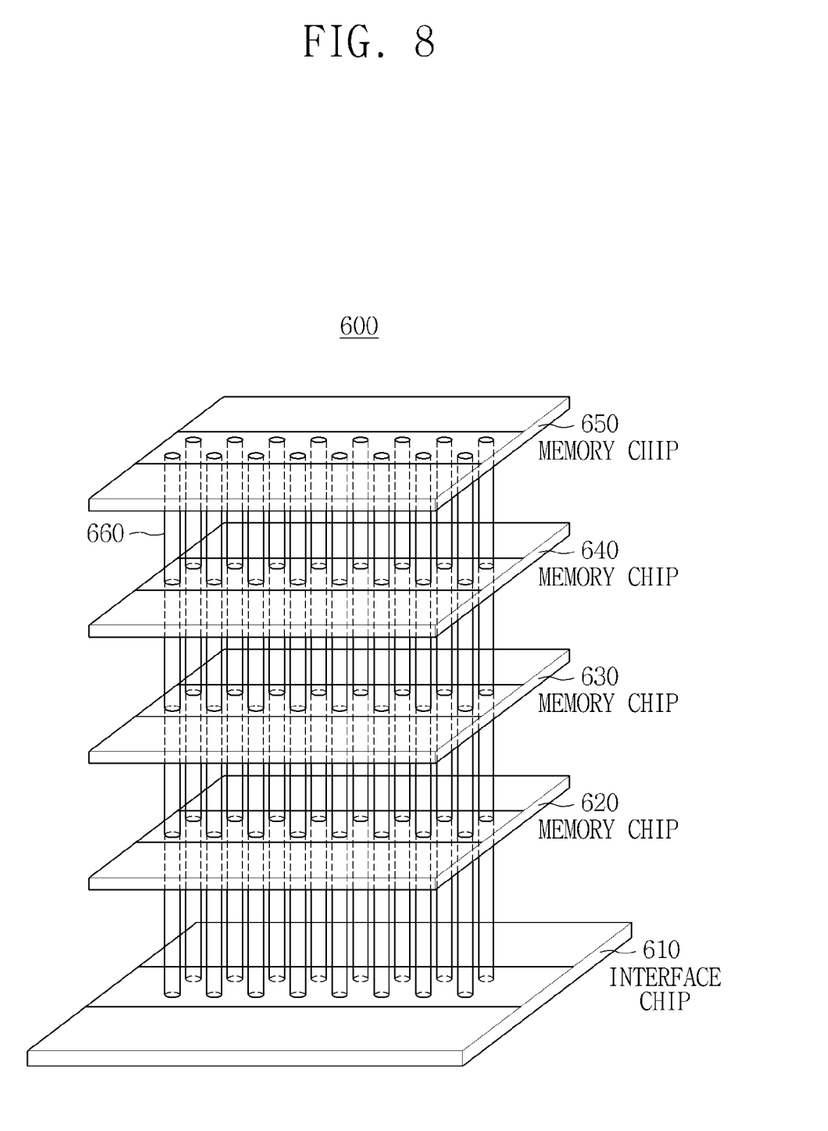
FIG. 8 is a perspective view of an example of a stacked semiconductor device including a semiconductor memory device in accordance with exemplary embodiments.

FIG. 8 is a perspective view of an example of a stacked semiconductor device 600 including a semiconductor memory device in accordance with exemplary embodiments.

Referring to FIG. 8, the stacked semiconductor device 600 may include an interface chip 610, and memory chips 620, 630, 640 and 650 which are electrically connected through through-silicon vias 660. Although the through-silicon vias 660 disposed in two rows are shown in FIG. 8, the stack semiconductor device 600 may include any number of through-silicon vias.

The memory chips 620, 630, 640 and 650 included in the stacked semiconductor device 600 may include an OTP memory according to exemplary embodiments. The interface chip 610 performs as an interface between the memory chips 620, 630, 640 and 650 and an external device.

Figure 9:
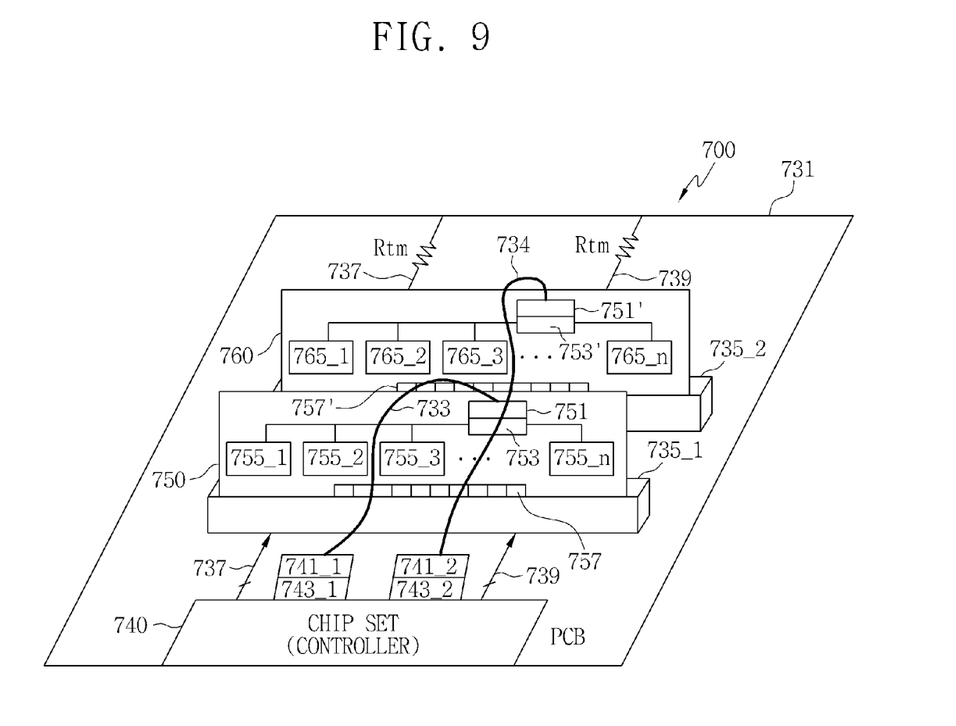
FIG. 9 is a diagram of an example of a memory system including a semiconductor memory device according to exemplary embodiments.

FIG. 9 is a diagram of an example of a memory system 700 including a semiconductor memory device according to exemplary embodiments.

Referring to FIG. 9, the memory system 700 may include a motherboard 731, a chip set (or a controller) 740, slots 735_1 and 735_2, memory modules 750 and 760, and transmission lines 733 and 734. Buses 737 and 739 connect the chip set 740 with the slots 735_1 and 735_2. A terminal resistor Rtm may terminate each of the buses 737 and 739 on a printed circuit board (PCB) of the motherboard 731.

For convenience, in FIG. 9, only two slots 735_1 and 735_2 and two memory modules 750 and 760 are shown. However, the memory system 700 may include an arbitrary number of slots and memory modules.

The chip set 740 may be mounted on the PCB of the motherboard 731, and control the operation of the memory system 700. The chip set 740 may include connectors 741_1 and 741_2 and converters 743_1 and 743_2.

The converter 743_1 receives parallel data generated by the chip set 740, converts the parallel data to serial data, and outputs the serial data to the transmission line 733 via the connector 741_1. The converter 743_1 receives serial data via the transmission line 733, converts the serial data to parallel data, and outputs the parallel data to the chip set 740.

The converter 743_2 receives parallel data generated by the chip set 740, converts the parallel data to serial data, and outputs the serial data to the transmission line 734 via the connector 741_2. The converter 743_2 receives serial data via the transmission line 734, converts the serial data to parallel data, and outputs the parallel data to the chip set 740. The transmission lines 733 and 734 included in the memory system 700 may be a plurality of optical fibers.

The memory module 750 may include a plurality of memory devices 755_1 to 755_n, a first connector 757, a second connector 751, and a converter 753. The memory module 760 may include a plurality of memory devices 765_1 to 765_n, a first connector 757', a second connector 751', and a converter 753'.

The first connector 757 may transfer low-speed signals received from the chip set 740 to the memory devices 755_1 to 755_n, and the second connector 751 may be connected to the transmission line 733 for transferring high-speed signals.

The converter 753 receives serial data via the second connector 751, converts the serial data to parallel data, and outputs the parallel data to the memory devices 755_1 to 755_n. Further, the converter 753 receives parallel data from the memory devices 755_1 to 755_n, converts the parallel data to serial data, and outputs the serial data to the second connector 751.

The memory devices 755_1 to 755_n and 765_1 to 765_n may include a semiconductor memory device according to embodiments of the inventive concept. Therefore, the memory devices 755_1 to 755_n and 765_1 to 765_n may include an OTP cell array according to embodiments of the inventive concepts. The memory devices 755_1 to 755_n and 765_1 to 765_n may be a volatile memory chip such as a DRAM and an SRAM, a NVM chip such as a flash memory, a phase change memory, a magnetic random access memory (MRAM), or a resistive random access memory (RRAM), or a combination of thereof.

Figure 10:
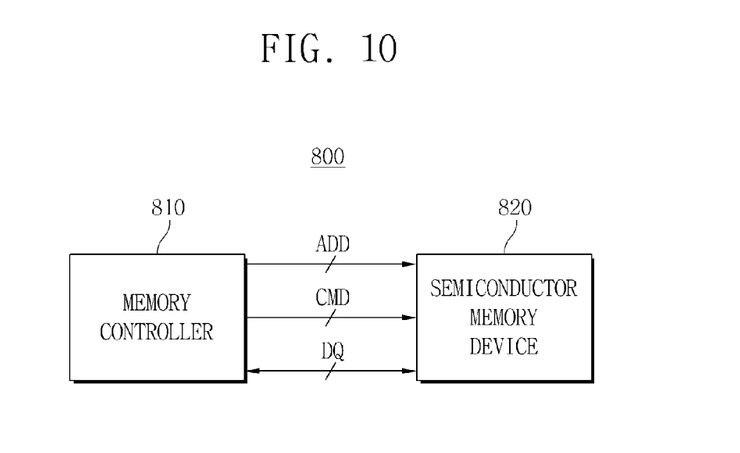
FIG. 10 is a block diagram of another example of a memory system including a semiconductor memory device according to exemplary embodiments.

FIG. 10 is a block diagram of another example of a memory system 800 including a semiconductor memory device according to exemplary embodiments.

Referring to FIG. 10, the memory system 800 includes a memory controller 810 and a semiconductor memory device 820.

The memory controller 810 generates an address signal ADD and a command signal CMD and provides the address signal ADD and the command signal CMD to the semiconductor memory device 820 through buses. Data DQ may be transmitted from the memory controller 810 to the semiconductor memory device 820 through the bus, or transmitted from the stacked semiconductor memory device 820 to the memory controller 810 through the bus.

The semiconductor memory device 820 may include the OTP memory according to exemplary embodiments.

Figure 11:
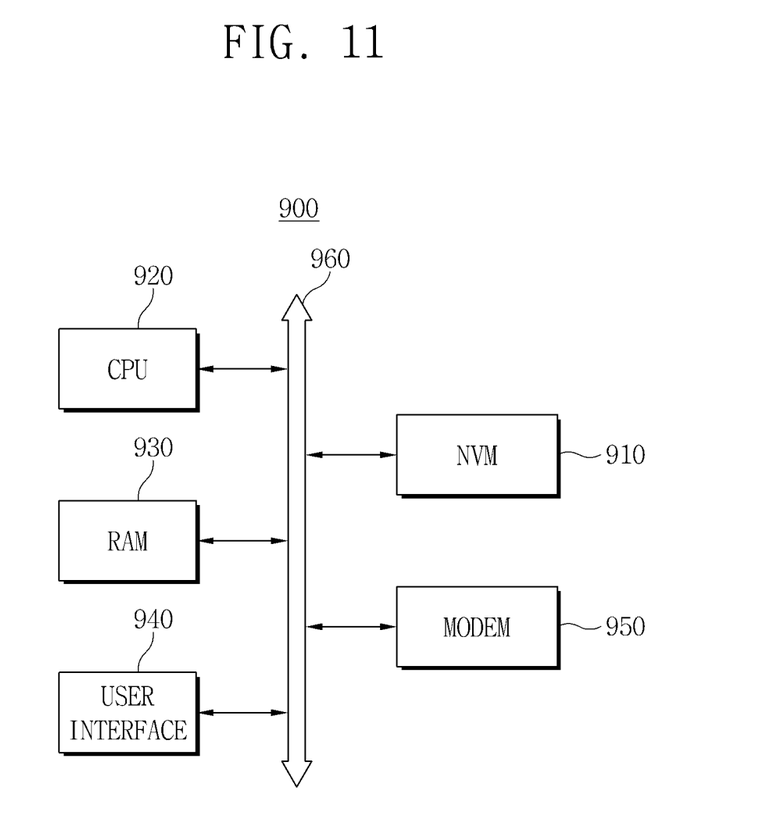
FIG. 11 is a block diagram of an example of an electronic system including a semiconductor memory device according to exemplary embodiments.

FIG. 11 is a block diagram of an example of an electronic system 900 including a semiconductor memory device according to exemplary embodiments.

Referring to FIG. 11, the electronic system 900 in accordance with exemplary embodiments may include a central processing unit (CPU) 920 electrically connected to a system bus 960, a random access memory (RAM) 930, a user interface 940, a modem 950 such as a baseband chipset, and a NVM device 910.

The NVM 910 and the RAM 930 store or output data, and include various logic circuits therein for driving. When the electronic system 900 according to exemplary embodiments is a mobile device, a battery that supplies the operating voltage to the electronic system 900 may be additionally provided (not shown). Although not shown in FIG. 11, the electronic system 900 may include an application chipset, a camera image processor, and a mobile DRAM, that is obvious to one of ordinary skill in the art. The NVM 910, for example, may comprise a solid state drive/disk (SSD) including NVM devices for storing data. Further, the NVM 910 may comprise a fusion flash memory in which an SRAM, a NAND flash memory and a NOR interface logic are combined.

A semiconductor device according to exemplary embodiments may be applied to a part of the electronic system 900. For example, when the electronic system 900 is booting, the exemplary embodiments may be applied to set operating environments. Each of the NVM 910 and the RAM 930 may include the OTP memory according to exemplary embodiments, and may be programmed by a method of programming the OTP memory according to exemplary embodiments. The OTP memory may include a plurality of fuse cells in which two or more fuse cells are programmed at a time, and, in a program mode, when a current flowing through each of the fuse cells increases to a certain value, the OTP memory blocks the current flowing through each of the fuse cells. Therefore, the OTP memory is able to program two or more fuse cells at a time without increasing a current-supplying capacity of a high voltage generator.

The semiconductor device and/or the system according to exemplary embodiments may be mounted using various types of packages. For example, the semiconductor device and/or the system may be mounted using packages such as package on package (POP), ball grid arrays (BGAs), chip scale packages (CSPs), plastic leaded chip carrier (PLCC), plastic dual in-line Package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), thin quad flatpack (TQFP), system in package (SIP), multi chip package (MCP), wafer-level fabricated package (WFP), and wafer-level processed stack package (WSP).

One or more exemplary embodiments may be applied to an OTP memory, and a semiconductor and a memory system including the OTP memory.

The foregoing is illustrative of exemplary embodiments and is not to be construed as limiting thereof. Although a few exemplary embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A one-time programmable (OTP) memory, comprising:
    a plurality of fuse cells in which two or more fuse cells are programmed at a time;
    a fuse array including the plurality of fuse cells connected to word lines, high voltage supplying lines and bit lines; and
    a high voltage generator configured to generate a high voltage and provide the high voltage to the fuse array through the high voltage supplying lines,
    wherein in a program mode, in response to determining that a current flowing through each of the fuse cells increases to a predetermined value, the OTP memory is configured to block the current flowing through each of the fuse cells, and
    wherein the OTP memory is able to program two or more fuse cells at a time without increasing a current-supplying capacity of the high voltage generator.

2. The OTP memory according to claim 1, wherein each of the fuse cells comprises at least one of an anti-fuse cell and an electric fuse cell.

3. The OTP memory according to claim 1, further comprising:
    a program control circuit configured to block the current flowing through each of the fuse cells in response to the determining that the current flowing through each of the fuse cells increases to the predetermined value in the program mode; and
    a column selecting circuit connected between the fuse array and the program control circuit, and configured to select columns to which fuse cells to be programmed are connected in the program mode.

4. The OTP memory according to claim 3, further comprising a sense amplifier configured to sense and amplify information of the fuse cells in a read mode, and output the information.

5. The OTP memory according to claim 4, wherein the sense amplifier comprises a plurality of sense amplifier circuits corresponding to the number of columns of the fuse array.

6. The OTP memory according to claim 3, wherein each of the fuse cells comprises:
    a first N-type metal oxide semiconductor (NMOS) transistor having a gate connected to a high voltage supplying line; and
    a second NMOS transistor having a gate connected to a word line, a drain connected to a source of the first NMOS transistor, and a source connected to a bit line.

7. The OTP memory according to claim 3, wherein the column selecting circuit comprises column selecting transistors configured to electrically connect or disconnect the bit lines and the program control circuit in response to a column selecting signal.

8. The OTP memory according to claim 3, further comprising a program inhibit circuit electrically connected to the bit lines to which fuse cells are connected, and configured to inhibit programming of unselected fuse cells.

9. The OTP memory according to claim 8, wherein the program inhibit circuit is configured to provide a high voltage to the bit lines connected to the fuse cells in response to the determining that the current flowing through each of the fuse cells increases to the predetermined value in the program mode.

10. The OTP memory according to claim 9, wherein the program inhibit circuit comprises a P-type metal oxide semiconductor (PMOS) transistor having a source to which a high voltage is applied, a gate to which a control signal is applied, and a drain connected to the bit lines, and
    wherein the control signal has the same phase as a program enable signal and has a level of a supply voltage if the program enable signal is logic high.

11. The OTP memory according to claim 3, wherein the program control circuit comprises:
    a differential amplifier connected between the column selecting circuit and a ground voltage, and configured to perform an amplification operation to generate a sensing current in response to a program down signal;
    a current source configured to provide an operating current to the differential amplifier;
    a program current detecting circuit configured to generate a program detection voltage based on the sensing current which is proportional to an amount of a current flowing through each of the fuse cells; and
    a program down signal generating circuit configured to generate the program down signal based on the program detection voltage and provide the program down signal to the differential amplifier.

12. The OTP memory according to claim 11, wherein the differential amplifier comprises:
    a first NMOS transistor having a drain connected to the column selecting circuit, a gate to which the program down signal is applied, and a source from which the sensing current is output;
    a second NMOS transistor having a drain connected to the current source, and a gate to which the program down signal is applied;
    a third NMOS transistor having a drain connected to the source of the first NMOS transistor, a source connected to the ground voltage, and a gate connected to a source of the second NMOS transistor; and
    a fourth NMOS transistor having a drain and a gate commonly connected to the source of the second NMOS transistor, and a source connected to the ground voltage.

13. The OTP memory according to claim 11, wherein the program down signal generating circuit comprises:
    an inverter configured to invert a phase of a program enable signal; and
    a NOR gate configured to perform a NOR operation on an output signal of the inverter and the program detection voltage to generate the program down signal.

14. The OTP memory according to claim 11, wherein the program current detecting circuit comprises:
    a PMOS transistor having a source connected to a supply voltage, and a gate to which a program enable bar signal, whose phase is opposite from a phase of a program enable signal, is applied;

a first NMOS transistor having a drain connected to a drain of the PMOS transistor, and a gate to which the sensing current is applied;

a second NMOS transistor having a gate and drain to which the sensing current is applied, and a source connected to the ground voltage;

a third NMOS transistor having a gate connected to a source of the first NMOS transistor, and a source connected to the ground voltage; and a latch circuit having an input terminal connected to a drain of the third NMOS transistor, and an output terminal from which the program detection voltage is output.

15. The OTP memory according to claim 14, wherein the program current detecting circuit further comprises a reset circuit connected between the output terminal of the latch circuit and the ground voltage, and configured to reset the output terminal of the latch circuit in response to a reset control signal.

16. The OTP memory according to claim 15, wherein the reset circuit comprises an NMOS transistor connected between the output terminal of the latch circuit and the ground voltage, and configured to perform a switch operation in response to the reset control signal.

17. A semiconductor memory device, comprising:
a memory cell array for storing data; and
a one-time programmable (OTP) memory configured to store a fail address corresponding to a defective memory cell of the memory cell array,
wherein the OTP memory comprises:
a plurality of fuse cells in which two or more fuse cells are programmed at a time;
a fuse array including the plurality of fuse cells connected to word lines, high voltage supplying lines and bit lines;
a high voltage generator configured to generate a high voltage and provide the high voltage to the fuse array through the high voltage supplying lines;
a program control circuit configured to block the current flowing through each of the fuse cells in response to the determining that the current flowing through each of the fuse cells increases to the predetermined value in the program mode; and
a column selecting circuit connected between the fuse array and the program control circuit, and configured to select columns to which fuse cells to be programmed are connected in the program mode,
wherein the OTP memory is configured to block a current flowing through each of the fuse cells in response to determining that the current flowing through each of the fuse cells increases to a predetermined value in a program mode.

18. The semiconductor memory device according to claim 17, further comprising:
an address buffer configured to receive the fail address;
a decoder configured to receive a control signal via a control buffer, perform decoding, and generate a mode enable signal; and
a controller activated according to the mode enable signal and configured to store the fail address in the OTP memory.

19. A semiconductor memory system, comprising:
a memory controller; and
a semiconductor memory device including a one-time programmable (OTP) memory,
wherein the OTP memory comprises:
a plurality of fuse cells in which two or more fuse cells are programmed at a time;
a fuse array including the plurality of fuse cells connected to word lines, high voltage supplying lines and bit lines;
a high voltage generator configured to generate a high voltage and provide the high voltage to the fuse array through the high voltage supplying lines;
a program control circuit configured to block the current flowing through each of the fuse cells in response to the determining that the current flowing through each of the fuse cells increases to the predetermined value in the program mode; and
a column selecting circuit connected between the fuse array and the program control circuit, and configured to select columns to which fuse cells to be programmed are connected in the program mode,
wherein the OTP memory is configured to block a current flowing through each of the fuse cells in response to determining that the current flowing through each of the fuse cells increases to a predetermined value in a program mode, and
wherein the memory controller is configured to generate an address signal and a command signal and provide the address signal and the command signal to the semiconductor memory device.

20. The semiconductor memory system according to claim 19, wherein the OTP memory is configured to store a fail address corresponding to a defective memory cell of a memory cell array, and the memory controller is configured to select a fuse cell in which the fail address is stored by transmitting data to the fuse cell.

* * * * *